United States Patent [19]

Sardeson et al.

[11] Patent Number: 5,461,588
[45] Date of Patent: Oct. 24, 1995

[54] MEMORY TESTING WITH PRESERVATION OF IN-USE DATA

[75] Inventors: Bruce A. Sardeson, Colorado Springs; Stephen J. Sicola, Monument, both of Colo.

[73] Assignee: Digital Equipment Corporation, Maynard, Mass.

[21] Appl. No.: 340,494

[22] Filed: Nov. 15, 1994

[51] Int. Cl.$^6$ .............................. G11C 7/00; G11C 29/00
[52] U.S. Cl. .......................................... 365/201; 371/21.1
[58] Field of Search .......................... 365/201; 371/21.1, 371/21.2, 21.3, 67.1

[56] References Cited

U.S. PATENT DOCUMENTS

| | | | |
|---|---|---|---|
| 3,655,959 | 4/1972 | Chernow et al. | 371/21.1 |
| 3,813,531 | 5/1974 | King et al. | 371/21.1 X |
| 5,157,664 | 10/1992 | Waite | 371/21.1 |
| 5,299,202 | 3/1994 | Vaillancourt | 371/21.1 |
| 5,392,294 | 2/1995 | Bosch et al. | 371/21.1 |
| 5,400,342 | 3/1995 | Matsumura et al. | 371/21.2 |

Primary Examiner—David C. Nelms
Assistant Examiner—Son Dinh
Attorney, Agent, or Firm—James F. Thompson; Ronald C. Hudgens

[57] ABSTRACT

A method of testing a memory containing data being used by a processor uses a dedicated diagnostic test page (DTP) and diagnostic status page (DSP) in the memory under test to carry out the testing. The DTP is address-tested and pattern-tested first. Then, each page of the memory is in turn copied to the DTP, tested, and then restored from the DTP. During the test, the address of the page being tested is stored in the DSP along with a valid flag and an error detection code (EDC). A recovery procedure uses the information on the DSP to restore memory pages if the test is interrupted.

2 Claims, 3 Drawing Sheets

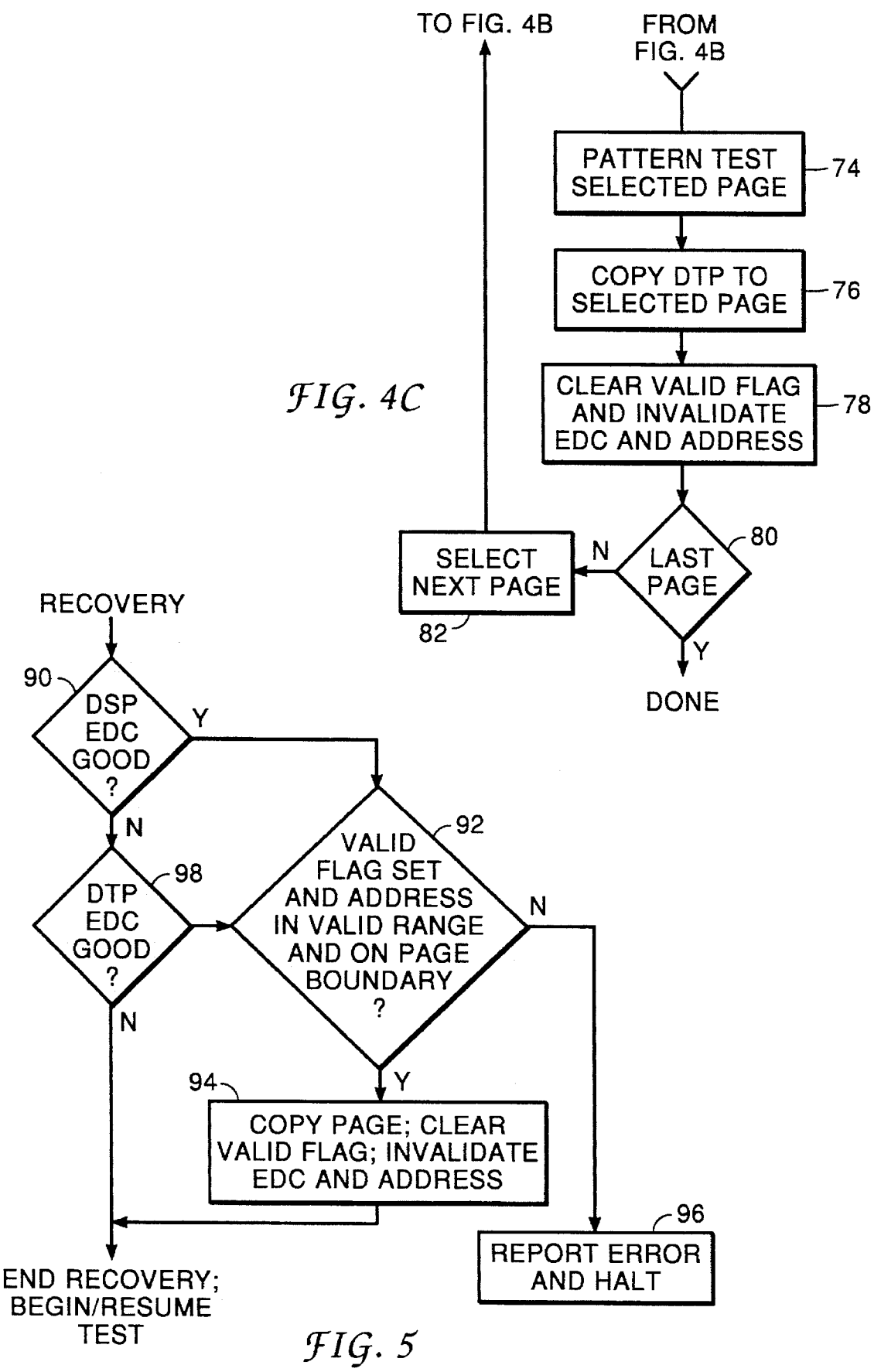

MEMORY TESTING WITH PRESERVATION OF IN-USE DATA

FIELD OF THE INVENTION

The invention relates to the field of computer memories, and more particularly to methods of diagnostic testing of such memories.

BACKGROUND OF THE INVENTION

Computer memories, like all electronic systems, are prone to various failures throughout their lifetimes. It is desirable to avoid the loss of important data when a memory failure occurs. Accordingly, it is necessary to test these memories either periodically or on demand during their useful lives, so that proper memory functioning is assured before data to be relied upon is stored in them.

Testing a memory generally involves writing data into the memory, reading it back, and checking to see that the retrieved data matches the data that was written. Any data that resides in the memory prior to such testing is overwritten during the test, and thus is lost. To avoid loss of useful data, then, it is generally desirable to test a memory when it is "empty", i.e., when it is not storing any data currently in use. A good time for testing main memory in a computer, for example, is immediately upon power-up but prior to loading operating system software.

Unfortunately, it is not always possible to test a memory when it is empty. For example, the memory may be part of a "server" computer that is generally always operating. In such a computer, significant portions of memory are always in use by the operating system, and thus are never empty during normal operation. There are likewise many other examples where data is forced to stay in a particular location in memory indefinitely. This situation implies the need to periodically test memory despite the presence of data that is currently being used.

The present invention is directed to this general need to test memories that are storing in-use data.

There are known techniques to accomplish memory testing in the presence of in-use data. According to one general method, the memory test is just run, and the memory contents are destroyed. Such a technique can only be used if it is possible to somehow re-establish the memory contents after running the test. In general, such capability implies that a "shadow" copy of the memory contents is stored elsewhere. Although there are some special examples of memory systems where such shadow copies can be found, such as in systems using write-through caches, the vast majority of memory systems do not enjoy this luxury. Therefore this technique has limited applicability.

According to a second technique, the entire memory to be tested is copied elsewhere, the memory test is performed, and then the memory contents are restored. This technique has the advantages of safety and simplicity. However, it interrupts the use of memory for an extended time, and thus can degrade system performance. It also can require a significant amount of backup storage to hold the copy of memory if the memory to be tested is large.

A third technique is to either wait for non-restorable data to be expunged or to force such expunging periodically, and then test memory. This technique assumes that the data is "dynamic", i.e., only stored in memory when needed and then written out to a backing store. Accordingly, this third technique won't work at all on "static" data, i.e., data that stays in memory indefinitely. Also, this technique can degrade system performance by unduly delaying testing or by expunging critical data when needed by the processor.

SUMMARY OF THE INVENTION

In light of the limitations of prior memory testing methods as exemplified in the foregoing description, it is an object of the invention to safely test computer memory storing in-use data while minimizing the impact of such testing on the computer system's performance. It is also an object to minimize the need for additional buffer space to hold copies of in-use data, and to accommodate the presence of static as well as dynamic in-use data during testing.

In one aspect, the invention is a testing method that uses a dedicated diagnostic test page (DTP) and diagnostic status page (DSP) in the memory being tested. The DTP is address-tested and pattern-tested first. Then, each page of the memory is in turn copied to the DTP, tested, and then restored from the DTP. During the test, the address of the page being tested is stored in the DSP along with a valid flag, so that a recovery procedure can use the information in the DSP to restore memory pages if the test is interrupted.

In another aspect, the invention is a testing method including a recovery algorithm capable of restoring relocated pages after an interruption of the test. The recovery algorithm relies on the use of an error-detection code (EDC) protecting the address information stored in the DSP. When recovery is initiated, address and EDC locations on the DSP are read to see if they represent a valid EDC codeword. If so, additional checking is performed to determine if the address in the DSP is a valid page address. If so, the algorithm concludes that the test was interrupted at the indicated page, and restores that page from the DTP. Provision is also made for the special case when the testing of the DSP itself is interrupted. This case is identified by accessing the DTP for EDC and address information if the EDC check of the DSP fails. Similar checking is then performed on the DTP information as that done on the DSP information. If these checks reveal that the DSP was relocated to the DTP, the DSP is restored from the DTP and the recovery is complete.

The present invention realizes several advantages in line with its objectives. To begin with, data integrity is maintained as a result of copying each page prior to testing and keeping status information in the DSP to enable recovery if testing were to be disrupted, for example by a power failure. Also, testing's impact on system performance is minimized by testing memory one page at a time, as opposed for example to copying the entire memory elsewhere and then testing. The inventive testing method is also carried out largely "in-line", i.e., within the memory being tested. This feature minimizes the need for additional buffer storage space to hold copies of in-use data. Finally, although the test presumes that each page contains in-use data, the actual presence or absence of in-use data doesn't alter how the test is conducted. In particular, the test doesn't need to wait for data to be expunged, and thus works equally well in the presence of static as well as dynamic data.

Other objects, features and advantages of the invention will be apparent to those skilled in the art in light of the detailed description of an embodiment of the invention that follows.

BRIEF DESCRIPTION OF THE DRAWINGS

An embodiment of the invention is described below with reference to the accompanying drawings, in which:

FIG. 2 is a memory map of a memory to be tested in the computer system of FIG. 1;

FIG. 5 is a flowchart of a procedure used to recover from an interruption in the execution of the memory test algorithm of FIG. 4.

DETAILED DESCRIPTION

Figure 1:
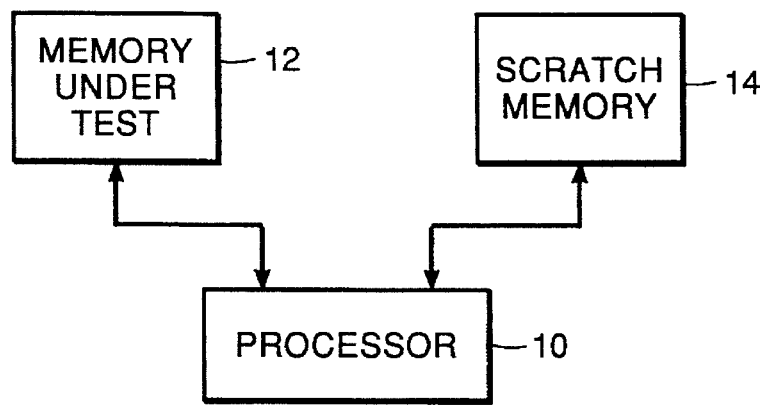
FIG. 1 is a block diagram of a computer system configured to carry out a testing method according to the principles of the present invention.

In FIG. 1, a conventional processor 10 is coupled to a pair of random-access memories 12 and 14. The memory 12 is a non-volatile memory and is referred to as the "memory under test", while the memory 14 may be volatile and is referred to as a "scratch memory". The memories 12 and 14 are both constructed in a conventional manner as arrays of semiconductor memory components.

FIG. 2 shows a memory map of the memory 12 that facilitates its testing as described in greater detail below. The ascending numbers at the left of the map are the starting byte addresses of the corresponding memory pages, given as hexadecimal values. A "page" in the illustrated embodiment is a naturally-aligned group of 512 contiguous byte locations. The addresses shown are referred to as the "page addresses" of the corresponding pages. Each page whose page address has only a single bit set to logic "one" is referred to as a "single-bit-addressable" page or SBA 20. One of the SBAs 20, in the illustrated embodiment the one having the highest SBA address 4000, is allocated as a diagnostic test page or DTP 22. Another page is allocated as a diagnostic status page or DSP 24. The SBAs 20, DTP 22, and DSP 24 are used in a special manner during testing as described in greater detail below.

The page having address 0000 in FIG. 2 is also denoted an "SBA" even though no bits are set in its address. This page is special because it is a potential alias of any of the other SBA pages 20 if the corresponding address bit is stuck at zero. Therefore it is treated like the other SBAs in the test algorithm.

Although as described above the page size and memory array size have specific values, it will be appreciated by those skilled in the art that the principles of the present invention may be readily applied to other memory structures in which these parameters have different values. Also, any of the SBA pages 20 may serve as the DTP 22, and any page except the DTP 22 may serve as the DSP 24.

Figure 3:
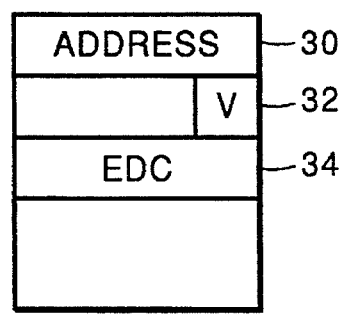
FIG. 3 is a memory map of a diagnostic status page in the memory of FIG. 2.

FIG. 3 shows that the DSP 24 includes an address location 30, a valid flag location 32, and an error detection code or EDC location 34. The address location 30 and valid flag location 32 are used to store information about the status of the test during its execution to aid in data recovery after an unforeseen interruption, such as a power failure. The use of these locations is described in greater detail below. The EDC location 34 holds protection data whose value depends on the values stored in the address location 30 and valid flag location 32 according to a predetermined error-detection code. Techniques for generating such protection information are well known. The main purpose for employing EDC is to enhance the distinction between a valid address stored in the address location 30 and "garbage", i.e., random data that could resemble a valid address. The use of EDC reduces the possibility of incorrect operation by reducing the chance that garbage is interpreted as a valid address.

Figure 4:
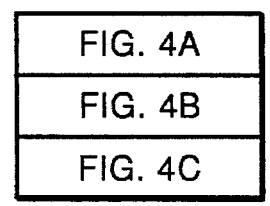
FIG. 4 (consisting of FIGS. 4A, 4B, and 4C) is a flowchart of a memory test algorithm carried out in the computer system of FIG. 1 according to the principles of the present invention.
Figure 4A:
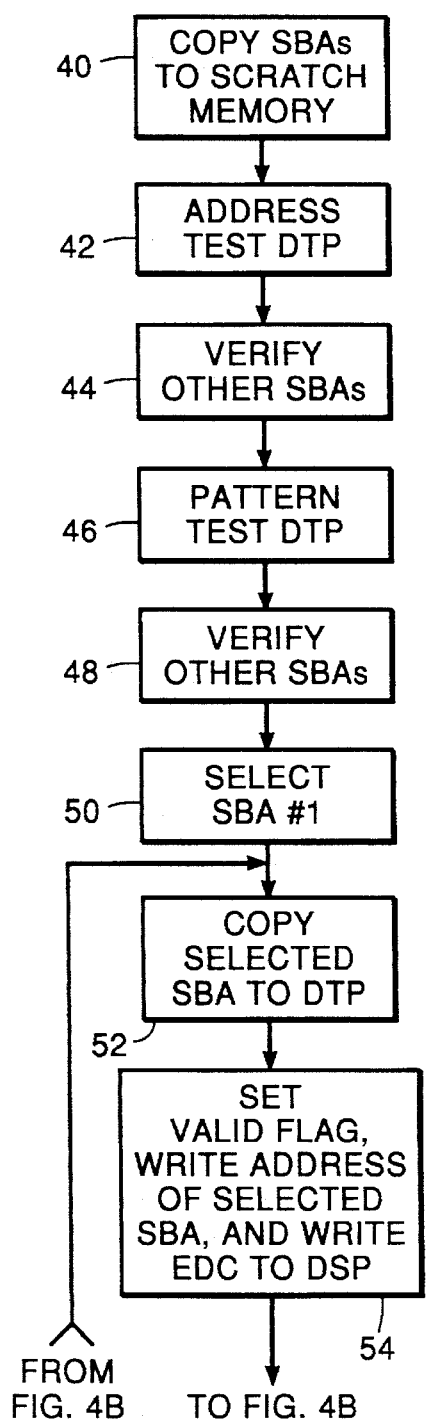
Figure 4B:
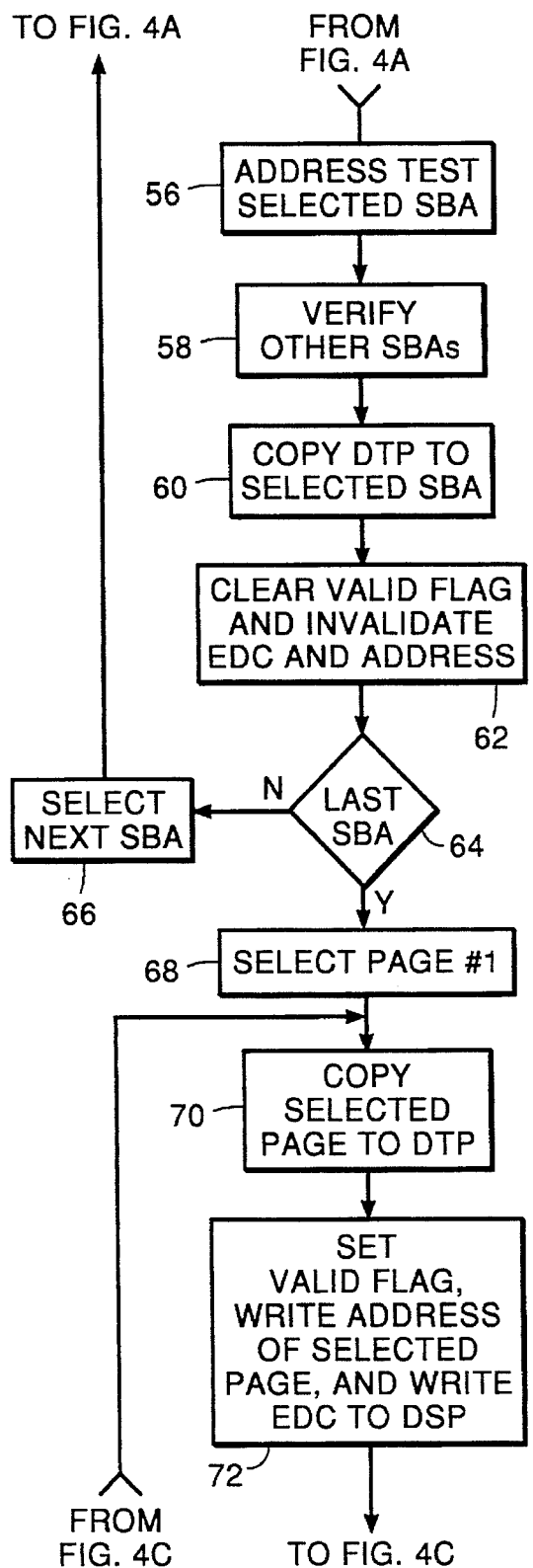

Turning now to FIG. 4, an embodiment of the test algorithm begins with a step 40 wherein all of the SBAs 20 of FIG. 2 are copied to the scratch memory 14 of FIG. 1. The scratch copies are used for verification during a later part of the test. Next, in step 42 an address test is performed on the DTP 22. In this address test, each byte in the DTP 22 is written with the least significant 8 bits of its address within the page. Then each byte location is read and its contents matched with what was written. This address testing tests most of the addressing functions of the DTP 22. It will be noted, however, that because only 256 unique patterns can be expressed in an 8-bit byte, each test pattern actually appears twice in the 512-byte DTP 22 of the illustrated embodiment. Therefore, the upper address bit is not fully tested. In the illustrated embodiment, this weakness is overcome during subsequent pattern testing as described below. In alternative embodiments, it may be feasible to ensure that the number of distinct test patterns is at least as great as the number of test locations so that fuller address testing can be performed. This could be done, for example, by writing a wider data word or by reducing the size of the page being tested. In any event, even partial address testing provides a good degree of fault localization.

After the DTP 22 has been address tested, the other SBAs 20 are verified in step 44 by comparing their contents with the scratch copies that were written to the scratch memory 14 in step 40. This is done to ensure that the address testing of step 42 did not change the contents of any of the other SBAs 20, as could happen, for example, if two address lines were shorted together in the memory 12. Upon the successful completion of step 44, the testing algorithm has verified the correct addressing of the DTP 22.

Next, in step 46, the DTP 22 is pattern tested in the following manner. In this test, all byte locations are first written with the pattern 55 hex. Then, each byte in sequence is manipulated as follows:

1) the byte is read and checked for a 55 pattern;

2) the byte is written with an AA pattern; and 3) the byte is read and checked for the AA pattern.

The above sequence checks individual data cells in each byte location. It also, because of its incremental nature, performs additional address testing. For example, suppose an address line is stuck at a fixed value, so that two regions of memory are aliased together. When AA is written to a location in the first such region, it destroys the 55 previously written in the corresponding aliased location in the second region. Therefore, when that corresponding location in the second region is read and checked against 55, the test fails.

In step 48, the other SBAs 20 are again verified to ensure that they haven't changed. Upon the successful completion of step 48, the ability of the DTP 22 to store data and provide it when addressed has been fully tested. At this point, the DTP 22 has been verified as being suitable as a temporary buffer for data from other pages of the memory 12 that are to be tested, a use to which the remainder of the test algorithm puts it.

Steps 50–66 of FIG. 4 implement an address test of the entire memory 12 with minimal disturbance of in-use data. It will be noted that steps 50, 64 and 66 merely cause the necessary looping to test each SBA 20 other than the DTP 22 according to remaining steps 52–62. For each SBA 20, its data is first copied to the DTP 22 in step 52. In step 54, the valid flag 32 in the DSP 24 is set, the address of the selected SBA is written in address location 30, and EDC data corresponding to the set valid flag and written address is stored in the EDC location 34. This step has the effect of indicating which page of the memory 12 is under test and therefore holds unpredictable data. This information is useful if the test is unexpectedly interrupted, such as by a power failure, so that recovery software can determine which page of memory 12 may have corrupted data. An embodiment of a recovery procedure is described with reference to FIG. 5 below.

In steps 56 and 58, the selected SBA 20 is address tested in the same manner as described above for the DTP 22. In step 60, the contents of the DTP 22 are copied back to the selected SBA 20 to restore its original data. Then in step 62, the valid flag 32 in the DSP 24 is cleared and the EDC location 34 and address location 30 are invalidated, indicating that the selected SBA 20 no longer has unpredictable data. Invalidating the EDC location 34 and address location 30 is preferably accomplished by writing an out-of-range address into the address location 30 and writing bad EDC into the EDC location 34. This clearing and invalidating step serves to emphasize that no page is being tested.

After the last SBA 20 has been tested in the foregoing manner, i.e., the YES branch of step 64 is taken, all of the addressing functions of the memory 12 have been tested, assuming a single stuck-at fault model.

It will be readily seen that remaining steps 68–82 implement a pattern test of the entire memory in a manner similar to the address testing of steps 50–66. The differences are (1) that every page (including the SBAs 20 but excluding the DTP 22) of memory 12 is tested, rather than only every SBA 20; and (2) the pages are pattern tested rather than address tested. The pattern test used is preferably the same as described above for the DTP 22. The sub-test of steps 68–82, like the sub-test of steps 50–66, employs the DSP 24 to aid in recovery if necessary.

In the special case where the DSP 24 has been relocated to the DTP 22, the actions of step 72 are carried out in the DTP 22 rather than the DSP 24. It is convenient to use fields in the DTP 22 whose addresses correspond to the addresses of the various fields in the DSP 24, i.e., fields having the same offset relative to the beginning of the page. In this special case, the DTP 22 effectively acts as a surrogate DSP.

It should be noted that in the foregoing description, whenever a page is copied from one place to another, it is preferable that the copying be verified by comparing the source page with the target page.

At the end of the test, the entire memory has been tested for single-bit address and memory cell faults with a minimum of disruption to user data. Also, only in-line relocation of pages has been used, thus keeping to a minimum the space required in the scratch memory 14. Finally, provision is made to recover from power failures or resets without causing an erroneous failure or loss of data.

FIG. 5 describes the recovery algorithm, which begins in step 90 by checking the EDC of the DSP 24. If the EDC check passes, it indicates that the DSP 24 likely has useful data, i.e., that a page test was interrupted and so recovery is necessary. In that case, then, additional checks are performed in step 92. These include testing whether the valid flag is set, and whether the address is a valid page address in a valid range. If so, the algorithm concludes that the test was interrupted during the test of the page whose address is stored in the DSP 24. It then proceeds in step 94 to copy the contents of the DTP 22 to the indicated page, thus restoring the data destroyed by the test; to clear the valid flag 32; and to invalidate the EDC field 34 and address field 30 in the DSP 24. At this point, recovery is complete, and testing can continue in the manner shown in FIG. 4.

If in step 92 the valid flag and address do not pass the various checks, then recovery is impossible. In that case, the algorithm proceeds to step 96 where an error is reported to operating system software and testing is halted.

If in step 90 the EDC in the DSP 24 is found to be bad, this indicates that the DSP 24 itself may have been under test when the test was interrupted. In that case, a valid copy of the DSP 24 may exist in the DTP 22. Therefore the algorithm proceeds to step 98 where the EDC test is performed on the contents of the DTP 22 as though it were the DSP 24. In other words, the locations on the DTP 22 that correspond to the EDC location 34, address location 30, and valid flag location 32 on the DSP 24 are read and their contents checked to see if they collectively represent a valid EDC codeword. If this test passes, then the tests of step 92 are performed on the contents of the DTP 22 (again, as though it were the DSP 24). It will be appreciated that if the DSP 24 has been relocated to the DTP 22, the address stored in the DTP 22 must be the page address of the DSP 24. Therefore, an additional check (not shown in FIG. 5) is performed to determine whether this is the case. If this check and the other checks of step 92 pass, it is concluded that the DSP 24 was relocated to the DTP 22. Then the actions of step 94 are taken, and recovery is complete. Otherwise, the actions of step 96 are taken.

The recovery algorithm of FIG. 5 is preferably initiated by some type of early warning of an impending interruption. A common example in a computer system is a power-fail interrupt, which is typically generated at the beginning of a power failure while there is still time to "clean up" in-progress activities. Absent such an early warning mechanism, it is preferable to perform the recovery procedure after the interruption has ceased but before resuming testing.

While the foregoing has described an embodiment of the data-preserving testing method of the present invention, there are alternative features that may be employed. As described, the SBAs 20 are not permanently allocated to the test; they are free for use by operational software. While this feature minimizes the amount of memory overhead for the test algorithm, it also requires more time and complication. It may be advantageous, therefore, in alternative embodiments to allocate the SBAs 20 for use by the test algorithm only, so that they may be freely used thereby without concern for the loss of in-use data. It should also be noted that because the status information in the DSP 24 may take up only a little space on the page, as is the case in the illustrated embodiment, the remainder of the DSP 24 may be used by operational software. And although it is preferable that the status fields in the DSP 24 reside on the same page, as is the case in the illustrated embodiment, it may be advantageous in alternative embodiments to allow them to reside on different pages at the expense of complicating the testing and recovery of those pages. Beyond these alternatives, there may be other embodiments as well that fall within the scope of the present invention as described by the following claims.

What is claimed is:

1. A method of testing a memory divided into pages, comprising the steps of:

copying contents of all single-bit-addressable (SBA) pages of said memory to a separate memory to create scratch copies thereof;

address testing, after said copying step, one of said SBA pages denoted a diagnostic test page (DTP);

comparing, after said DTP has been address tested, the contents of each SBA page in said memory, except for said DTP, with the corresponding scratch copy thereof to verify that the contents of said SBA pages have not changed as a result of the address testing of said DTP;

pattern testing said DTP after a preceding comparing step has been performed;

comparing, after said DTP has been pattern tested, the contents of each SBA page in said memory, except for said DTP, with the corresponding scratch copy thereof to verify that the contents of said SBA pages have not changed as a result of the pattern testing of said DTP;

after said DTP has been tested in the foregoing manner, performing for each SBA page in said memory except for said DTP the following steps:

(i) copying the contents of a page being tested to said DTP;

(ii) writing the address of the page being tested to an address location in one of pages denoted a diagnostic status page (DSP);

(iii) setting, after the preceding copying and writing steps have been performed, a valid flag in a valid flag location in said DSP to indicate that the address contained in said address location is the address of a page of said memory whose contents are unpredictable due to the testing thereof;

(iv) address testing the page being tested;

(v) comparing, after the address testing of the page being tested, the contents of each SBA page in said memory, except for the page being tested, with the corresponding scratch copy thereof to verify that the contents of said SBA pages have not changed as a result of the address testing of the page being tested;

(vi) copying, after the preceding address testing and comparing steps been performed, the contents of said DTP back to the page being tested; and (vii) clearing said valid flag in said DSP to indicate that no pages of said memory have unpredictable contents due to the testing thereof; and after said SBA pages have been tested in the foregoing manner, performing for all pages in said memory, except for said DTP, the following steps:

(i) copying the contents of the page being tested to said DTP;

(ii) writing the address of the page being tested to said address location in said DSP;

(iii) setting, after the preceding copying and writing steps, said valid flag in said DSP;

(iv) pattern testing the page being tested;

(v) copying, after the page being tested has been pattern tested, the contents of said DTP back to the page being tested; and (vi) clearing said valid flag in said DSP.

2. A method according to claim 1, further comprising a step of writing an error detection code (EDC) pattern to an EDC location in said DSP in conjunction with the writing of a page address to said address location and the setting of said valid flag, said EDC pattern corresponding to the page address being written and the value of said valid flag to enable subsequent detection of errors therein, and wherein the testing method is subject to a possible interruption because of which a recovery procedure is executed before the testing method may be resumed, said recovery procedure comprising the steps of:

determining whether the values stored in said address location, said valid flag location, and said EDC location on said DSP collectively represent a valid EDC codeword;

determining, if the values of said address location, said valid flag location, and said EDC location on said DSP are determined to represent a valid EDC codeword, whether said valid flag on said DSP is set and whether the value stored in said address location is within a valid range of addresses of pages of said memory that are to be tested and is a page address;

halting further testing if said valid flag on said DSP is not set or if the value stored in said address location is either not within said valid range of addresses or is not a page address;

performing the following steps if said valid flag on said DSP is set and the value stored in said address location is within said valid range of addresses and is a page address:

(i) copying the contents of said DTP to the page whose address is stored at said address location of said DSP;

(ii) clearing said valid flag on said DSP; and (iii) invalidating said address location and said EDC location on said DSP;

determining, if the values stored in said address location, said valid flag location, and said EDC location on said DSP are determined not to represent a valid EDC codeword, whether the values stored in locations on said DTP corresponding to said address location, said valid flag location, and said EDC location on said DSP collectively represent a valid EDC codeword;

determining, if the contents of said corresponding locations on said DTP are determined to represent a valid EDC codeword, whether the value stored in a location on said DTP corresponding to said valid flag location on said DSP equals a set valid flag and whether the value stored in the location on said DTP corresponding to said address location on said DSP is within said valid range of addresses and is equal to the address of said DSP;

halting further testing if the value stored in said location on said DTP corresponding to said valid flag location on said DSP does not equal a set valid flag or if the value stored in the location on said DTP corresponding to said address location on said DSP is not within said valid range of addresses or is not equal to the address of said DSP;

performing the following steps if the value stored in said location on said DTP corresponding to said valid flag location on said DSP equals a set valid flag and the value stored in the location on said DTP corresponding to said address location on said DSP is within said valid range of addresses:

(i) copying the contents of said DTP to a page whose address is stored at said address location of said DSP;

(ii) clearing the location on said DTP corresponding to said valid flag; and (iii) invalidating the locations on said DTP corresponding to said address location and said EDC location on said DSP.

* * * * *